United States Patent
Chen et al.

(10) Patent No.: US 6,495,432 B2
(45) Date of Patent: Dec. 17, 2002

(54) METHOD OF IMPROVING A DUAL GATE CMOS TRANSISTOR TO RESIST THE BORON-PENETRATING EFFECT

(75) Inventors: Chi-Chun Chen, Kaohsiung (TW); Horng-Chih Lin, Hsinchu (TW); Chun-Yen Chang, Hsinchu (TW); Tiao-Yuan Huang, Hsinchu (TW)

(73) Assignee: National Science Council, Taipei (TW)

( * ) Notice: Subject to any disclaimer, the term of this patent is extended or adjusted under 35 U.S.C. 154(b) by 7 days.

(21) Appl. No.: 09/834,268

(22) Filed: Apr. 12, 2001

(65) Prior Publication Data

US 2002/0022329 A1 Feb. 21, 2002

(30) Foreign Application Priority Data

Aug. 16, 2000 (TW) ........................................ 89116535 A

(51) Int. Cl.[7] .............................................. H01L 21/336
(52) U.S. Cl. ........................................ 438/515; 438/532
(58) Field of Search ................................ 438/301, 491, 438/514, 515, 517, 530, 532, 585

(56) References Cited

U.S. PATENT DOCUMENTS

| | | | |
|---|---|---|---|
| 5,629,221 A | * 5/1997 | Chao et al. | 257/411 |
| 5,674,788 A | * 10/1997 | Wristers et al. | 148/DIG. 118 |
| 5,851,889 A | * 12/1998 | Michael et al. | 438/301 |
| 6,001,677 A | * 12/1999 | Shimizu | 438/231 |
| 6,030,874 A | * 2/2000 | Grider et al. | 438/301 |
| 6,323,094 B1 | * 11/2001 | Wu | 438/303 |

* cited by examiner

Primary Examiner—Richard Elms
Assistant Examiner—Beth E. Owens
(74) Attorney, Agent, or Firm—Fish & Richardson P.C.

(57) ABSTRACT

A method of reducing the boron-penetrating of effect in a CMOS transistor provides a silicon substrate, which comprises an isolating area, an active area and a gate oxide layer formed on the silicon substrate in the active layer. A polysilicon layer is then deposited on the silicon substrate. Next, boron ions ($B^+$) are doped into the polysilicon layer. Next, a gate photoresist with a predetermined gate pattern is formed on the polysilicon layer. The polysilicon not covered by the gate photoresist is then etched to form a polysilicon gate. The gate photoresist is used as a mask to dope boron difluoride ions ($BF_2^+$) into the silicon substrate. Finally, after removing the gate photoresist, a tempering procedure is performed to form a shallow junction area of a source/drain region on the silicon substrate.

12 Claims, 3 Drawing Sheets

METHOD OF IMPROVING A DUAL GATE CMOS TRANSISTOR TO RESIST THE BORON-PENETRATING EFFECT

BACKGROUND OF THE INVENTION

1. Field of the Invention

The present invention relates to a method of fabricating integrated circuit devices, and more particularly, to a method of improving a dual gate of a CMOS transistor to resist the boron-penetrating effect.

2. Description of the Prior Art

In the early stages of MOS transistor development, the gate is mainly made of metal, such as aluminum. However, metal cannot withstand high-temperature tempering in subsequent processes. Therefore, polysilicon possessing good interface characteristics on an oxide layer and the ability to withstand high-temperature processes is popularly employed to fabricate the gate. For general complementary MOS (CMOS) transistors, an n$^+$-type polysilicon is used as the gate of an n-type channel MOS transistor and the gate of an p-type channel MOS transistor at the same time, referred to as a single poly scheme. Despite the single poly scheme's simple processes, the absolute value of the threshold voltage of the p-type MOS transistor is very great (>1). The bottleneck occurs when processing line widths are smaller than 0.35 µm, and the main problem is the short channel effect in the p-type MOS transistor.

A dual poly scheme is an advanced technique in fabricating the gate, which employs p$^+$-type polysilicon to form the gate of the p-type MOS transistor so as to manufacture surface channel devices, but has more complicated processes. Since the surface channel devices, such as the p-type MOS transistor and the n-type MOS transistor, have better control over the short channel effect, utilizing the dual scheme to manufacture the surface channel devices has become the main technique in 0.25~0.18 µm line-width processing. With dual polysilicon structure, serious consideration should be made of the boron ions' penetration of the gate oxide layer of the p-type MOS transistor, and the resulting damage. If the boron ions penetrate through the gate oxide layer to the substrate, they will diminish the absolute value of the threshold voltage of the p-type MOS transistor and even disable the device, causing shutdown so as to break down the circuitry. It will also decrease the property and reliability of the gate oxide layer.

The main reason for the boron-penetrating effect is that the boron ion in the oxide layer has a high diffusion coefficient, thus the boron-penetrating effect frequently occurs in high-temperature processes, especially in deep micrometer processing for manufacturing super-thin gate oxide layers. The existence of the fluoride ions will accelerate the boron-penetrating effect when the BF$_2^+$ implantation substitutes the boron implantation in order to effectively form a shallow junction. Methods of restraining the boron-penetrating effect follow.

1. Grow a stacked polysilicon gate. The grain boundaries of the polysilicon layers can be mutually staggered, therefore the average value of the boron-diffusion path can be lengthened to delay the boron-diffusion effect. Nonetheless, the increase in relative steps will raise production costs, and the parasitic resistance of the gate will be enlarged.

2. Grow an amorphous silicon (a-Si) gate. Because the crystallized a-Si whose grain size is larger, the crystallized a-Si can delay the boron-diffusion effect. Also, the grain boundary of the crystallized a-Si can surround the fluoride ions to ease the boron-diffusion effect. Unfortunately, growing a-Si consumes much time, which decreases the boron activation and enlarges the parasitic resistance of the gate.

3. Dope the nitride ions into the polysilicon layer. The resulting B-N bonding delays the boron-diffusion effect. Also, the nitride ions existing on the interface between the polysilicon layer and the oxide layer can delay the boron-diffusion effect. Yet, since the existence of the nitride ions may decrease boron activation, the parasitic resistance of the gate will be increased as the concentration of nitride ions is increased.

4. Grow a very thin nitride-containing polysilicon layer by chemical vapor deposition (CVD) on an interface between polysilicon and oxide. The interface between polysilicon and oxide is utilized to obstruct the boron-diffusion effect so as to slow down the boron penetration. However, the nitride ions still increase the parasitic resistance of the gate.

5. The boron ion implantation substitutes the BF$_2^+$ implantation to solve the problem caused by the fluoride ions. However, it is not easy to form a shallow junction at the source/drain region by the boron ion implantation.

6. An oxynitride layer substitutes the conventional oxide layer.

SUMMARY OF THE INVENTION

In consideration of the deterioration of the thinned gate oxide layer caused by the boron-penetrating effect, the object of the present invention is to provide a method of improving a dual gate of the CMOS transistor to resist the boron-penetrating effect.

There is provided, in the present invention, to dope the boron ions into a polysilicon gate in order to prevent the boron-penetrating effect being accelerated by the fluoride ions. The BF$_2^+$ ions are then doped into the polysilicon gate to form an extended source/drain region and complete a shallow junction. A gate photoresist layer that is utilized to define a predetermined gate pattern fully stops the BF$_2^+$ ions entering the polysilicon gate so as to achieve self-alignment.

It is an advantage of the present invention that the p-type device is improved to have a better ability to resist the boron-penetrating effect and the super shallow junction is completed by the BF$_2^+$ ions. Also, the method of the present invention achieves the self-alignment result and has no need for extra processes and masks. Furthermore, the method is simply and practically applicable to mass production and integrated circuit processing.

This and other objectives of the present invention will no doubt become obvious to those of ordinary skill in the art after having read the following detailed description of the preferred embodiment which is illustrated in the various figures and drawings.

BRIEF DESCRIPTION OF THE DRAWINGS

The present invention can be more fully understood by reading the subsequent detailed a description in conjunction with the examples and references made to the accompanying drawings, wherein.

DETAILED DESCRIPTION OF THE PREFERRED EMBODIMENT

Figure 1A:
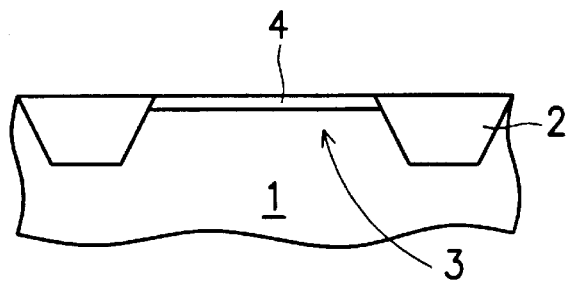
FIG. 1A to FIG. 1G are schematic diagrams of a method for improving a CMOS transistor to resist the boron-penetrating effect according to the present invention.
Figure 1B:
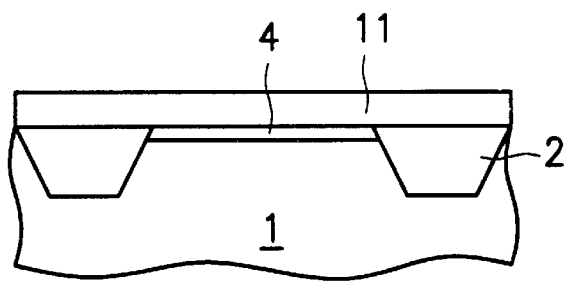
Figure 1C:
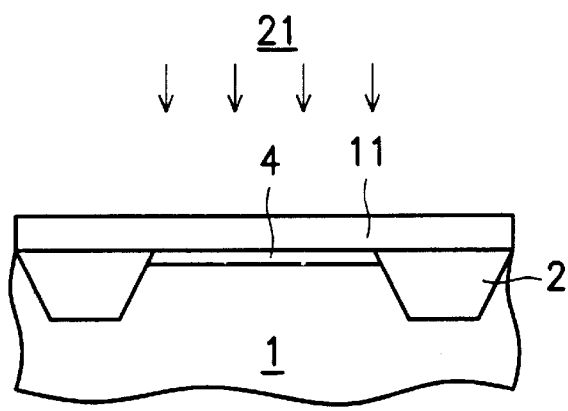

Please refer to FIG. 1A to FIG. 1G. FIG.1A to FIG. 1G are schematic diagrams of a method for improving a CMOS transistor to resist the boron-penetrating effect according to the present invention. With reference to FIG. 1A, an n-type semiconductor substrate 1 is applied to fabricate a p-type device. After defining an active area 3 and an isolating area 2 on the substrate 1, a gate oxide layer 4 is grown on the active area 3 by placing the substrate 1 in a thermal condition. In another preferred embodiment (not shown), an oxynitride layer can be immediately grown on the active area 3 if the substrate 1 is placed in an $N_2O$ or NO atmosphere. Next, as shown in FIG. 1B, a polysilicon layer 11 is deposited on the substrate 1 using a low-pressure chemical vapor deposition (LPCVD) tube furnace. Then, as shown in FIG. 1C, the $B^+$ ions 21 are doped into the polysilicon layer 11 by an ion implantation, wherein the dosage is about 1E15~1E16 $cm^{-2}$ and the doping energy is about 10~50 KeV.

Figure 1D:
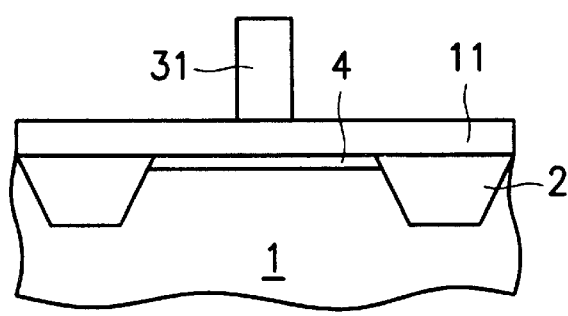
Figure 1E:
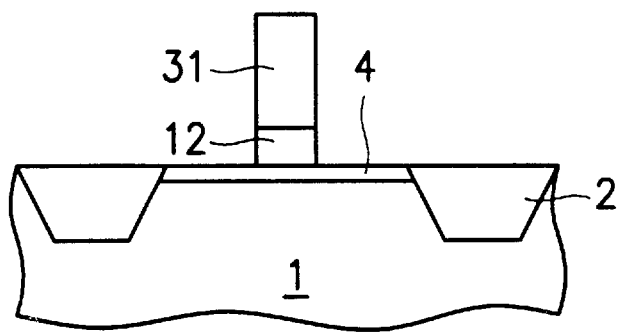
Figure 1F:
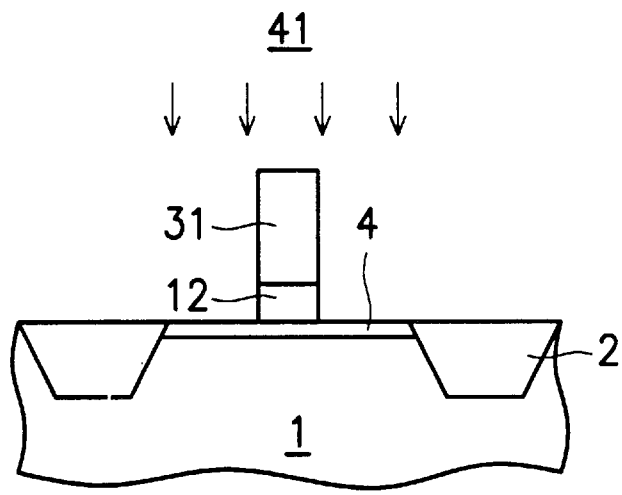

With reference to FIG. 1D, a gate photoresist layer 31 is formed on the polysilicon layer 11, wherein the gate layer 31 is defined by coating a photoresist layer (not shown), and utilizing a photolithography process to transfer a predetermined gate pattern to the photoresist layer. Next, an activated plasma etching process is performed to remove the polysilicon layer 11 not covered by the gate photoresist 31, and the remaining polysilicon layer 11 serves as a polysilicon gate 12, as shown in FIG. 1E. Before removing the gate photoresist 31, as shown in FIG. 1F, the $BF_2^+$ ions 41 are doped into an extended source/drain region (which may directly form a source/drain doping region) by an ion implantation whose dosage is about 1E13 to 1E15 $cm^{-2}$, and doping energy is about 0.1~20 KeV. Therefore, a shallow junction 61 (shown in FIG. 1G) is primarily formed by the $BF_2^+$ ions 41. Also, the gate photoresist 31 exactly stops the $BF_2^+$ ions from entering the polysilicon gate 12 to prevent the boron-penetrating effect from being accelerated by the fluoride ions.

Figure 1G:
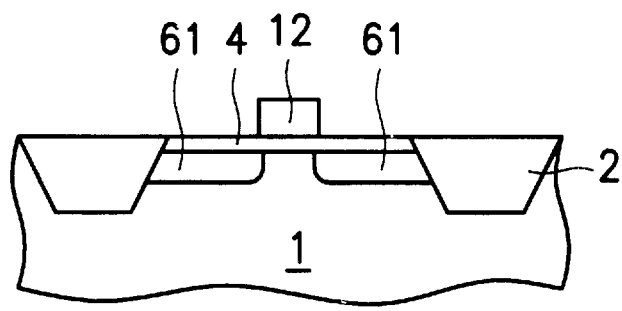

Finally, after the gate photoresist 31 is removed, as shown in FIG. 1G, a source/drain shallow junction 61 is completed by performing a tempering procedure in a tube furnace at 600~850° C. for 10~60 minutes. In another preferred embodiment, the tempering procedure can be performed in a rapid tempering furnace at 900~1050° C. for 1~60 seconds.

Figure 2:
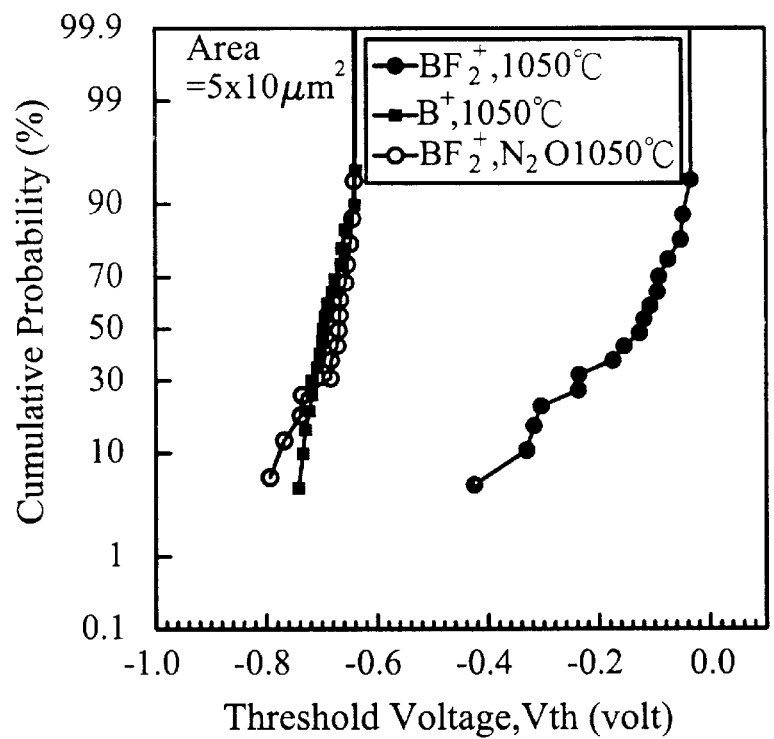
FIG. 2 shows the drift situation of the threshold voltage.

According to experimental tests, it is believed that the present invention can dramatically improve the gate oxide layer of the p-type device's ability to resist the boron-penetrating effect. Please refer to FIG. 2. FIG. 2 shows the drift of the threshold voltage. With regard to the device that has the conventional oxide layer and is doped by the $BF_2^+$ ions, the boron-penetrating effect causes a noticeable drift of the threshold voltage after performing the rapid annealing activated process on the device at 1050° C. for 10 seconds. The threshold voltage varying from −0.4 V to −0.1 V shows a wide drift toward positive voltage. With regard to the boron-doping device formed by the present invention, no apparent drift of the threshold voltage is found and thereby the boron-penetrating effect is thought to be insensitive to the boron-doping device. In addition, in view of the value of the threshold voltage, the boron-doping device formed by the present invention resists the boron-penetrating effect as well as the well-known oxynitride layer does.

Figure 3:
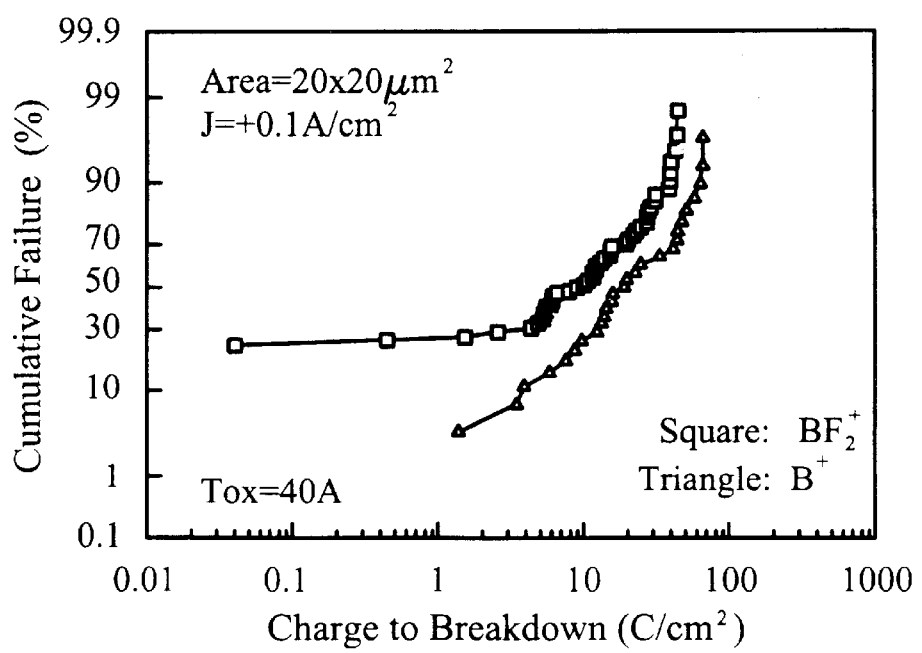
FIG. 3 shows the variation of the breakdown voltage.

In regard to the reliability of the gate oxide layer, it is experimentally proven that the device formed according to the present invention can be improved as shown in FIG. 3. FIG. 3 shows the variation of the breakdown voltage. Because fluoride ions accelerate the boron-penetrating effect's deterioration of the conventional oxide layer, the device with the conventional oxide layer and the $BF_2^+$ ion implantation has a lower value of breakdown voltage. By comparison, for the device formed by the present invention, the gate oxide layer can be made of the oxynitride layer that has a better ability to resist the boron penetration. Also, the $BF_2^+$ ions can be stopped from entering the polysilicon gate by the gate photoresist, hence the deterioration of the gate oxide layer is prevented from the boron-penetrating effect that is accelerated by the fluoride ions. As a result, the device formed by the present invention has a higher breakdown voltage value.

The present invention uses the boron ions and $BF_2^+$ ions as the dopants of the source/drain region so as to form a shallow junction and improve the reliability of the gate oxide layer. Also, the present invention is a simple process which employs the gate photoresist that is utilized for defining the gate pattern to isolate the fluoride ions. Furthermore, the present invention is a practical process which is wholly applicable to integrated circuit processing and has no need for extra processes and masks.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of reducing a boron-penetrating effect in a MOS transistor, comprising the steps of:
    (a) providing a silicon substrate which comprises an isolating area, an active area and a gate oxide layer formed on the silicon substrate in the active area;
    (b) depositing a polysilicon layer on the silicon substrate;
    (c) doping boron ions (B+) into the polysilicon layer;
    (d) forming a gate photoresist with a predetermined gate pattern on the polysilicon layer;
    (e) etching the polysilicon not covered by the gate photoresist to form a polysilicon gate;
    (f) using the gate photoresist as a mask to dope boron difluoride ions ($BF_2^+$) into the silicon substrate;
    (g) removing the gate photoresist; and
    (h) performing a tempering procedure to form a shallow junction area of a source/drain region in the silicon substrate.

2. The method of claim 1, wherein the step (d) comprises:
    (d1) forming a photoresist layer on the polysilicon layer; and
    (d2) performing a photolithography process on the photoresist layer to transfer the predetermined gate pattern, and thereby forming the gate photoresist.

3. The method of claim 1, wherein the gate oxide layer is grown in an oxygen atmosphere.

4. The method of claim 1, wherein the gate oxide layer is grown in an NO or $N_2O$ atmosphere.

5. The method of claim 1, wherein a depth of the gate oxide layer is 1.5~10 nm.

6. The method of claim 1, wherein the polysilicon layer with a depth of 100~300 nm is formed by a low pressure chemical vapor deposition (LPCVD) method.

7. The method of claim 1, wherein a dosage of the boron ion (B+) is 1E15~1E16 $cm^{-2}$ and a doping energy of the boron ion (B+) is 10~50 KeV.

8. The method of claim 1, wherein the polysilicon gate is formed by an activated plasma etching method.

9. The method of claim 1, wherein a dosage of the boron difluoride ion ($BF_2^+$) is 1E13~1E15 $cm^{-2}$ and a doping energy of the boron difluoride ion ($BF_2^+$) is 0.1~20 KeV.

10. The method of claim 1, wherein the tempering procedure is performed in a tube furnace at 600~850°C. for 10~60 minutes.

11. The method of claim 1, wherein the tempering procedure is performed in a rapid tempering furnace at 900~1050°C. for 1~60 seconds.

12. The method of claim 1, wherein the method is applied to a p-type MOS transistor.

* * * * *